United States Patent
Peng et al.

(10) Patent No.: US 9,171,993 B2
(45) Date of Patent: Oct. 27, 2015

(54) LED DIE AND METHOD OF MANUFACTURING THE SAME

(71) Applicant: ADVANCED OPTOELECTRONIC TECHNOLOGY, INC., Hsinchu Hsien (TW)

(72) Inventors: Chien-Chung Peng, Hsinchu (TW); Tzu-Chien Hung, Hsinchu (TW); Chia-Hui Shen, Hsinchu (TW); Chih-Jung Liu, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/459,564

(22) Filed: Aug. 14, 2014

(65) Prior Publication Data
US 2015/0048305 A1  Feb. 19, 2015

(30) Foreign Application Priority Data
Aug. 14, 2013  (CN) .......................... 2013 1 0352683

(51) Int. Cl.
| | | |
|---|---|---|
| H01L 33/00 | (2010.01) |
| H01L 33/06 | (2010.01) |
| H01L 33/32 | (2010.01) |
| H01L 33/42 | (2010.01) |
| H01L 33/46 | (2010.01) |
| H01L 33/20 | (2010.01) |

(52) U.S. Cl.
CPC ........ *H01L 33/0025* (2013.01); *H01L 33/0075* (2013.01); *H01L 33/06* (2013.01); *H01L 33/20* (2013.01); *H01L 33/32* (2013.01); *H01L 33/42* (2013.01); *H01L 33/46* (2013.01); *H01L 2933/0016* (2013.01); *H01L 2933/0025* (2013.01)

(58) Field of Classification Search
None
See application file for complete search history.

(56) References Cited

U.S. PATENT DOCUMENTS

| | | | | |
|---|---|---|---|---|
| 2007/0085095 | A1* | 4/2007 | Ko et al. ........................ | 257/94 |
| 2009/0283789 | A1* | 11/2009 | Kim et al. ....................... | 257/99 |
| 2012/0228580 | A1* | 9/2012 | Wang et al. ..................... | 257/13 |
| 2013/0168718 | A1* | 7/2013 | Shin et al. ....................... | 257/98 |

FOREIGN PATENT DOCUMENTS

TW   201310703 A1   3/2013

* cited by examiner

*Primary Examiner* — Scott B Geyer
(74) *Attorney, Agent, or Firm* — Novak Druce Connolly Bove + Quigg LLP

(57) ABSTRACT

An LED die includes a substrate, a light emitting structure, electrodes, a first transparent protecting layer, a reflection layer, and a second transparent protecting layer. The light emitting structure includes a first semiconductor layer, an active layer, a second semiconductor layer successively formed on the substrate. A part of first semiconductor layer being exposed. A first electrode is formed the first semiconductor layer. A second electrode is formed on the second semiconductor layer. The first transparent protecting layer, the reflection layer, and the second transparent protecting layer successively formed on the first electrode. The present disclosure also provides a method of manufacturing the LED die.

20 Claims, 3 Drawing Sheets

LED DIE AND METHOD OF MANUFACTURING THE SAME

CROSS-REFERENCE TO RELATED APPLICATIONS

This application claims priority to Chinese Patent Application No. 201330352683.2 filed on Aug. 14, 2013 in the State Intellectual Property Office Of The P. R. C, the contents of which are incorporated by reference herein.

FIELD

The disclosure relates to an LED (light emitting diode) die and a method of manufacturing the LED die.

BACKGROUND

An LED die typically includes a light emitting structure and electrodes. Electrodes can electrically connect the light emitting structure to a PCB (printed circuit board).

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected. The term "electronically coupled" can include any coupling that is via a wired or wireless connection. The electronic coupling can be through one or more components or it can include a direct connection between the described components.

Figure 1:
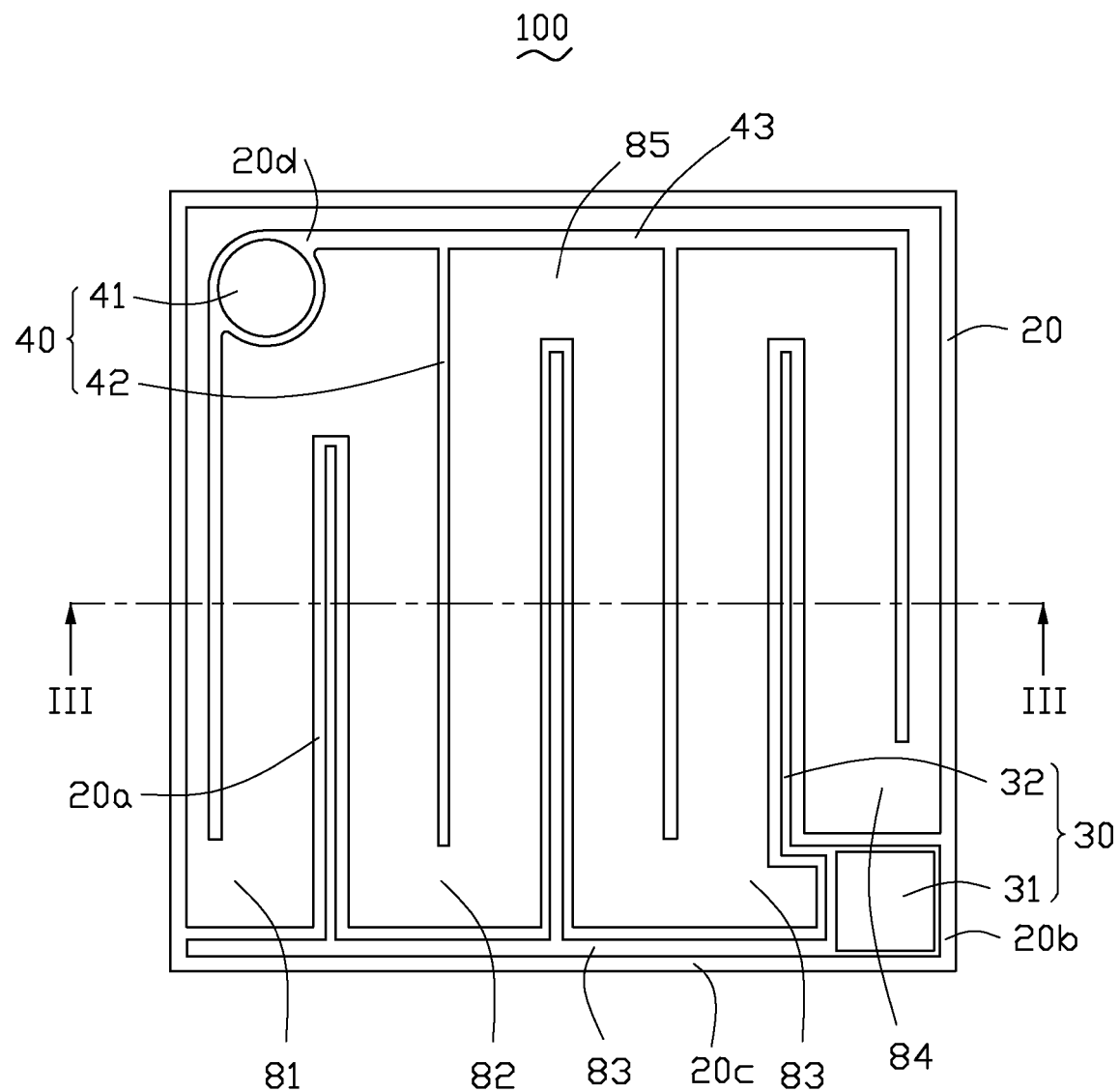
FIG. 1 is a top view showing an LED die in accordance with an exemplary embodiment of the present disclosure.
Figure 2:
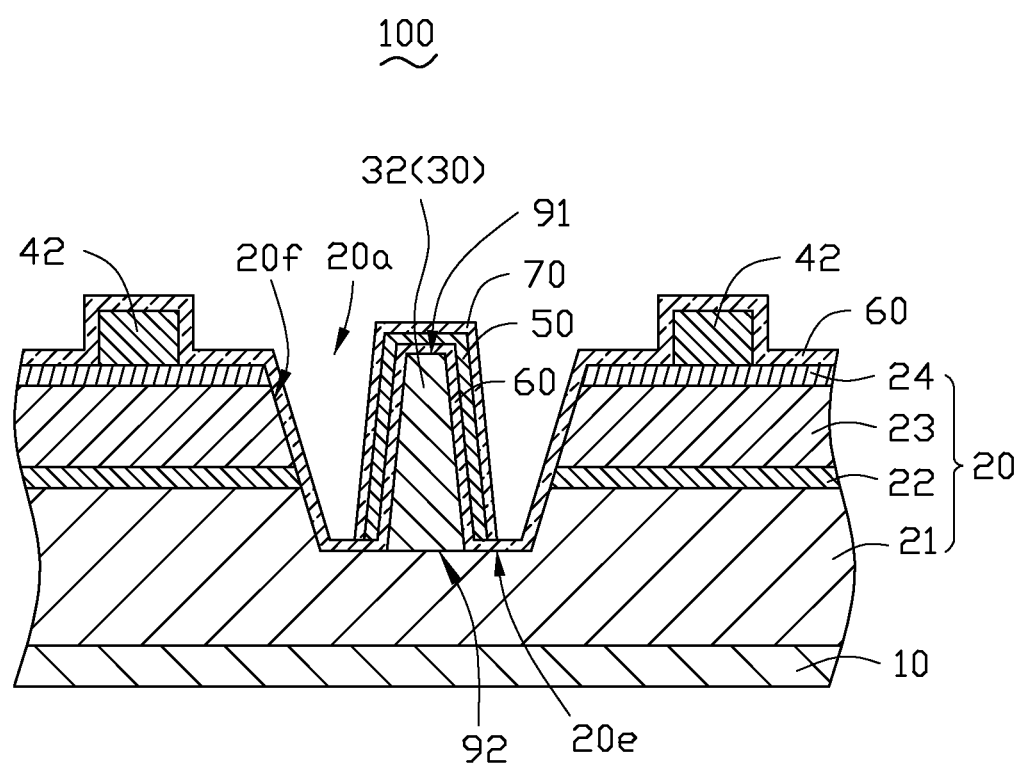
FIG. 2 is a partial-cross section view showing the LED die of FIG. 1.

Referring to FIGS. 1 and 2, an LED die 100 includes a substrate 10, a light emitting structure 20 formed on the substrate 10, and a first electrode 30 and a second electrode 40 formed on the light emitting structure 20.

The substrate 10 can be made of sapphire, silicon carbide (SiC), silicon (Si), gallium arsenide (GaAs), lithium metaaluminate ($LiAlO_2$), magnesium oxide (MgO), zinc oxide (ZnO), gallium nitride (GaN), aluminium nitride (AlN) or indium nitride (InN). The substrate 10 can be made of monocrystal.

The light emitting structure 20 comprises a first semiconductor layer 21, an active layer 22, and a second semiconductor layer 23. The first semiconductor layer 21, the active layer 22, and the second semiconductor layer 23 are successively formed on the substrate 10. In at least one embodiment, the first semiconductor layer 21 is an N-type doped semiconductor layer, and the second semiconductor layer 23 is a P-type doped semiconductor layer. The N-type doped semiconductor layer can be made of $Al_xGa_{1-x}N$ ($0 \leq x < 1$), and doped with an N-type impurity. There are no particular limitations for the n-type impurity, and suitable examples include silicon, germanium (Ge), or tin (Sn), etc. The active layer 22 is laminated on the top of the first semiconductor layer 21, the active layer 22 can be a single quantum well structure, a multiple quantum well structure, or the like. The P-type doped semiconductor layer can be made of $Al_xGa_{1-x}N$ ($0 < x < 1$), and doped with a P-type impurity, the P-type impurity can be made of magnesium (Mg), zinc (Zn) or beryllium (Be), etc. In an alternative embodiment, the first semiconductor layer 21 and the second semiconductor layer 23 can be a P-type doped semiconductor layer and an N-type doped semiconductor layer, respectively.

The light emitting structure 20 can also include a transparent conducting layer 24. The transparent conducting layer 24 is formed on the second semiconductor layer 23 by evaporation, sputtering, etc. The transparent conducting layer 24 can be made of indium tin oxide (ITO), indium zinc oxide (IZO), aluminum zinc oxide (AZO), gallium zinc oxide (GZO), gallium indium oxide (GIO), indium gallium zinc oxide (IGZO).

A plurality of grooves 20a, a first connecting area 20c and a flat area 20b are formed from the transparent conducting layer 24 to the first semiconductor layer 21 by etching. The first connecting area 20c is formed at peripheral flanges of the light emitting structure 20. The grooves 20a are connected to the flat area 20b by the first connecting area 20c. The grooves 20a are perpendicular to and extend from the first connecting area 20c. The first connecting area 20c extends from the flat area 20b. A flank 20f of each groove 20a can be an inclined surface. The grooves 20a are parallel to each other.

A part of first semiconductor layer 21 can be exposed. In at least one embodiment, the first semiconductor layer 21 can be exposed through the grooves 20a, the first connecting area 20c and the flat area 20b. A bottom 20e of each groove 20a, the first connecting area 20c and the flat area 20b are the exposed parts of the first semiconductor layer 21.

The number of the grooves 20a is three in the present embodiment. The three grooves 20a define four finger areas 81, 82, 83, 84 and a second connecting area 85 in the light emitting structure 20. Each groove 20a is located between two adjacent finger areas. In FIG. 1, there are a first finger area 81, a second finger area 82, a third finger area 83, and a fourth finger area 84 distributed from left to right. The first finger area 81, the second finger area 82, the third finger area 83, and the fourth finger area 84 are perpendicular to and extend from the second connecting area 85. The second connecting area 85 is opposite to the first connecting area 20c. The second connecting area 85 is parallel to the first connecting area 20c.

A first electrode 30 can be formed on the first semiconductor layer 21 by evaporation, sputtering, etc. The first electrode 30 can be made of gold (Au). The first electrode 30 includes a first body 31, a first arm 33 and a plurality of first fingers 32. The first fingers 32 are perpendicular to and extend from the first arm 33. The first arm 33 extends from the first body 31. The first body 31 is formed on the flat area 20b. The first arm 33 is formed on the first connecting area 20c. Each first finger 32 is formed on the bottom 20e of a groove 20a corresponding to the first finger 32. The first fingers 32 are parallel to each other. In at least one embodiment, a cross-section of the first fingers 32 is trapezoid which has a top edge 91 and a bottom edge 92. A width of the top edge 91 is shorter than that of the bottom edge 92.

A second electrode 40 can be formed on the second semiconductor layer 23 by evaporation, sputtering, etc. The second electrode 40 can be made of Au. The second electrode 40 includes a second body 41, a second arm 43 and a plurality of second fingers 42. The second fingers 42 are perpendicular to and extend from the second arm 43. The second arm 43 extends from the second body 41. The second fingers 42 are parallel to each other. The second body 42 is formed on a corner area 20d of the light emitting structure 20. The corner area 20d is opposite to the flat area 20b. The second arm 43 is formed on the second connecting area 85. The second fingers 41 are formed on the four finger area 81, 82, 83, 84. In at least one embodiment, the second electrode 40 can be formed on the transparent conducting layer 24.

The first arm 33 of the first electrode 30 can be parallel to the second arm 43 of the second electrode 40.

A first transparent protecting layer 60 can be formed on the light emitting structure 20. The first transparent protecting layer 60 covers the transparent conducting layer 24, the bottoms 20e and the flanks 20d of the grooves 20a, the first fingers 32 and the first arm 33 of the first electrode 30 and the second fingers 42, the second arm 43 of the second electrode 40. The first body 31 of the first electrode 30 and the second body 41 of the second electrode 40 are exposed through the first transparent protecting layer 60. The first transparent protecting layer 60 can be made of silicon dioxide, silicon nitride ($Si_3N_4$) or titanium dioxide ($TiO_2$).

A reflection layer 50 is formed on the first transparent protecting layer 60. The reflection layer 50 can be made of aluminum (Al), titanium (Ti), chromium (Cr), nickel (Ni), argentums (Ag), platinum (Pt), tungsten (W), rhodium (Rh) or molybdenum (Mo). As shown in FIG. 2, a part of the first transparent protecting layer 60 formed on the first fingers 32 is covered by the reflection layer 50.

A second transparent protecting layer 70 is formed on the reflection layer 50. The second transparent protecting layer 70 can be made of silicon dioxide, silicon nitride or titanium dioxide. The second transparent protecting layer 70 can cover the reflection layer 50.

Figure 3:
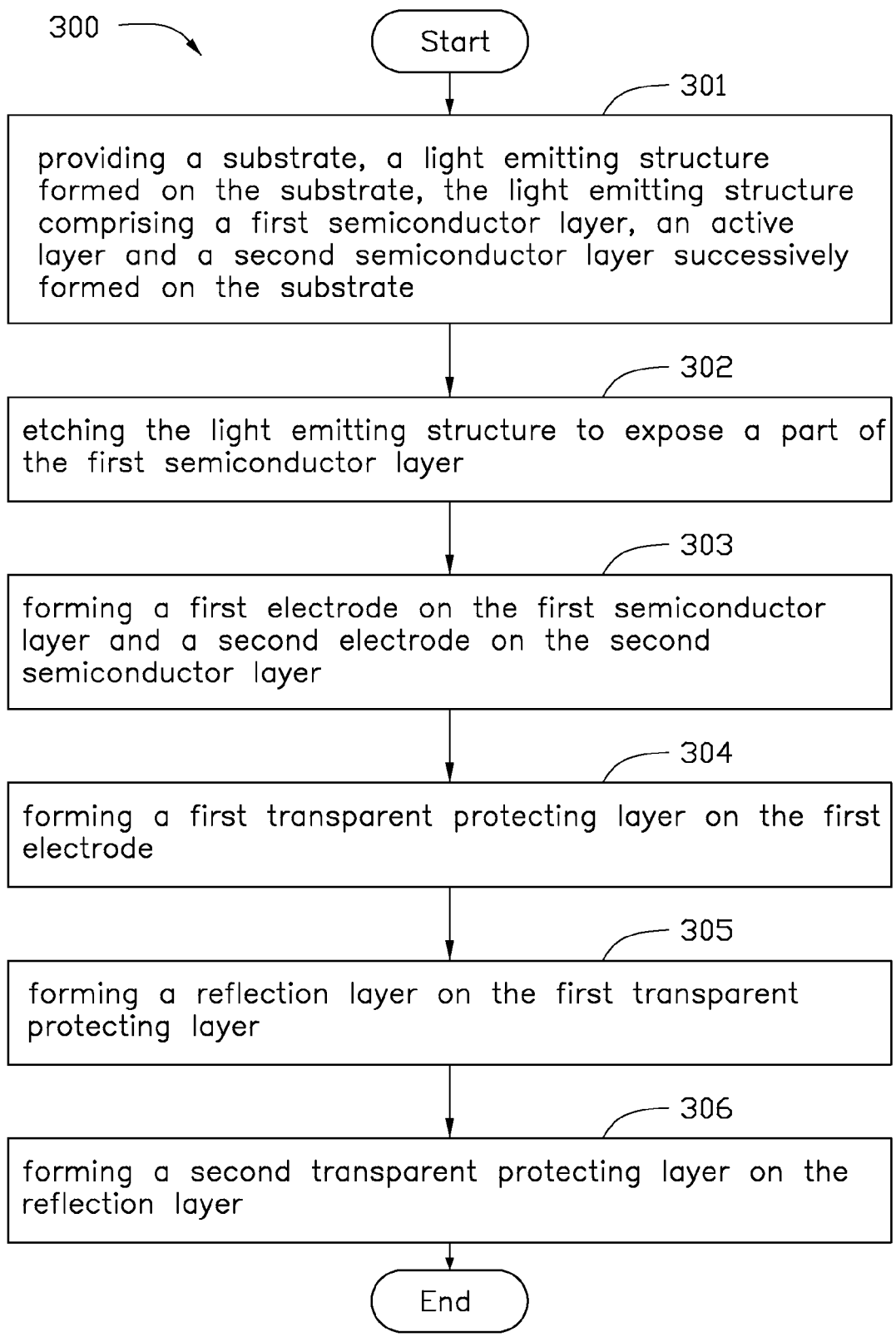
FIG. 3 is a flow chart of a method of manufacturing an LED die in accordance with an exemplary embodiment of the present disclosure.

Referring to FIG. 3, a flowchart is presented in accordance with an embodiment of a method of manufacturing an LED die. The method 300 is provided by way of example, as there are a variety of ways to carry out the method. The method 300 described below can be carried out using the configurations illustrated in FIGS. 1 and 2, for example, and various elements of these figures are referenced in explaining the method 300. Each block shown in FIG. 3 represents one or more process, method, or subroutines, carried out in the method 300. Furthermore, the illustrated order of blocks is illustrative only and the order of the blocks can be changed. Additional blocks can be added or fewer blocks may be utilized without departing from this disclosure. The method 300 can begin at block 301.

At Block 301, a substrate 10 is provided. A light emitting structure 20 is formed on the substrate 10. The light emitting structure 20 includes a first semiconductor layer 21, an active layer 22 and a second semiconductor layer 23. The first semiconductor layer 21, the active layer 22, the second semiconductor layer 23 are successively formed on the substrate 10. In at least one embodiment, the light emitting structure 20 also includes a transparent conducting layer 24. A transparent conducting layer 24 is formed on the second semiconductor layer 23.

At Block 302, a plurality of grooves 20a, a first connecting area 20c and a flat area 20b are formed on the light emitting structure 20. A part of first semiconductor layer 21 is exposed. The grooves 20a, a first connecting area 20c and a flat area 20b can be made by etching the light emitting structure 20 to expose the first semiconductor layer 21. The grooves 20a can be parallel to each other. In at least one embodiment, a bottom 20e of each groove 20a, the first connecting area 20c and the flat area 20b are the exposed part of the first semiconductor layer 21. A flank 20f of each groove 20a can be an inclined surface.

In at least one embodiment, the number of the grooves 20a is three. The three grooves 20a define four finger areas 81, 82, 83, 84 and a second connecting area 85 in the light emitting structure 20. Each groove 20a is located between two adjacent finger areas. The four finger areas 81, 82, 83, 84 are perpendicular to and extended from the second connecting area 85. The second connecting area 85 is opposite to the first connecting area 20c. The second connecting area 85 is parallel to the first connecting area 20c.

At Block 303, a first electrode 30 is formed on the first semiconductor layer 21. A second electrode 40 is formed on the transparent conducting layer 24. The first electrode 30 includes a first body 31 formed on the flat area 20b, a first arm 33 formed on the first connecting area 20c and a plurality of first fingers 32 formed on the grooves 20a. The second electrode 40 includes a second body 41 formed on a corner area 20d, a second arm 43 formed on the second connecting area 85 and a plurality of second fingers 42 formed on the finger areas 81, 82, 83, 84.

It is understood that there are no particular limitations on the number of the grooves and the number of finger areas.

At Block 304, a first transparent protecting layer 60 is formed on the first electrode 30. The first transparent protecting layer 60 can cover the transparent conducting layer 24, the bottoms 20e and the flanks 20d of the grooves 20a, the first fingers 32 and first arm 33 of the first electrode 30 and the second fingers 42 and the second arm 43 of the second electrode 40. The first body 31 of the first electrode 30 and the second body 41 of the second electrode 40 are exposed through the first transparent protecting layer 60.

At Block 305, a reflection layer 50 can be formed on the first transparent protecting layer 60. The first transparent protecting layer 40 formed on the first fingers 32 can be covered by the reflection layer 50.

At Block 306, a second transparent protecting layer 70 can be formed on the reflection layer 50. The second transparent protecting layer 70 can cover the reflection layer 50.

It is to be further understood that even though numerous characteristics and advantages have been set forth in the foregoing description of embodiments, together with details of the structures and functions of the embodiments, the disclosure is illustrative only; and that changes may be made in detail, including in matters of shape, size, and arrangement of parts within the principles of the disclosure to the full extent indicated by the broad general meaning of the terms in which the appended claims are expressed.

The embodiments shown and described above are only examples. Many details are often found in the art such as the other features of an LED die and a method of manufacturing the LED die. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. An LED die comprising:
   a substrate;
   a light emitting structure comprising a first semiconductor layer, an active layer, a second semiconductor layer successively formed on the substrate, and a part of first semiconductor layer being exposed;
   a first electrode formed on the exposed part of the first semiconductor layer;
   a second electrode formed on the second semiconductor layer; and
   a first transparent protecting layer, a reflection layer, and a second transparent protecting layer successively formed on the first electrode.

2. The LED die of claim 1, wherein the first semiconductor layer is exposed by etching.

3. The LED die of claim 1, further comprising a transparent conducting layer formed on the second semiconductor layer, and the second electrode is formed on the transparent conducting layer.

4. The LED die of claim 3, further comprising a plurality of grooves, a first connecting area and a flat area connecting with each other, the grooves, the first connecting area and the flat area are formed from the transparent conducting layer to the first semiconductor layer by etching, and the part of first semiconductor layer is exposed through the grooves, the first connecting area and the flat area.

5. The LED die of claim 4, wherein the grooves are parallel to each other.

6. The LED die of claim 4, wherein each groove comprises a flank, and each flank is an inclined surface.

7. The LED die of claim 4, wherein the first electrode comprises a first body, a first arm and a plurality of first fingers, the first fingers are extended from the first arm, the first arm is extended from the first body, each first finger is formed on a bottom of each groove, the first arm is formed on the first connecting area, and the first body is formed on the flat area.

8. The LED die of claim 7, wherein the first fingers are parallel to each other.

9. The LED die of claim 7, wherein the light emitting structure is divided into a plurality of finger areas and a second connecting area by the grooves.

10. The LED die of claim 9, wherein the second electrode comprises a second body, a second arm and a plurality of second fingers, the second fingers are extended from the second arm, the second arm is extended from the second body, each second finger is formed on a finger area, the second arm is formed on the second connecting area, and the second body is formed on a corner area of the light emitting structure.

11. The LED die of claim 10, wherein the corner area is opposite to the flat area.

12. The LED die of claim 10, wherein the second fingers are parallel to each other.

13. The LED die of claim 10, wherein the first transparent protecting layer covers the transparent conducting layer, the bottoms and the flanks of the grooves, the first finger and the first arm of the first electrode and the second fingers and the second arm of the second electrode, the first body of the first electrode and the second body of the second electrode is exposed through the transparent protecting layer.

14. A method of manufacturing an LED die comprising:
   providing a substrate, a light emitting structure formed on the substrate, the light emitting structure comprising a first semiconductor layer, an active layer and a second semiconductor layer successively formed on the substrate;
   etching the light emitting structure to expose a part of the first semiconductor layer;
   forming a first electrode on the first semiconductor layer and a second electrode on the second semiconductor layer;
   forming a first transparent protecting layer on the first electrode;
   forming a reflection layer on the first transparent protecting layer; and
   forming a second transparent protecting layer on the reflection layer.

15. The method of claim 14, further comprising: a transparent conducting layer formed on the second semiconductor layer, and the second electrode is formed on the transparent conducting layer.

16. The method of claim 15, wherein the part of the first semiconductor layer which is exposed further comprising a plurality of grooves, a first connecting area and a flat area connecting with each other.

17. The method of claim 16, wherein the first electrode comprises a first body, a first arm and a plurality of first fingers, the first fingers are extended from the first arm, the first arm is extended from the first body, each first finger is formed on a bottom of each groove, the first arm is formed on the first connecting area, and the first body is formed on the flat area.

18. The method of claim 17, wherein the light emitting structure is divided into a plurality of finger areas and a second connecting area by the grooves.

19. The method of claim 18, wherein the second electrode comprises a second body, a second arm and a plurality of second fingers, the second fingers are extended from the second arm, the second arm is extended from the second body, each second finger is formed on a finger area, the second arm is formed on the second connecting area, and the second body is formed on a corner area of the light emitting structure.

20. The method of claim 19, wherein the first transparent protecting layer covers the transparent conducting layer, the bottoms and the flanks of the grooves, the first finger and the first arm of the first electrode and the second fingers and the second arm of the second electrode, the first body of the first electrode and the second body of the second electrode are exposed through the transparent protecting layer.

* * * * *